US009675175B1

(12) United States Patent
Chen et al.

(10) Patent No.: US 9,675,175 B1
(45) Date of Patent: Jun. 13, 2017

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/263,793

(22) Filed: Sep. 13, 2016

(30) Foreign Application Priority Data

Jan. 29, 2016 (TW) .............................. 105102998 A

(51) Int. Cl.
| | | |
|---|---|---|
| A47B 88/00 | (2017.01) | |
| A47B 88/12 | (2006.01) | |
| A47B 88/04 | (2006.01) | |
| A47B 57/36 | (2006.01) | |
| A47B 96/07 | (2006.01) | |
| H05K 7/18 | (2006.01) | |

(52) U.S. Cl.
CPC .............. *A47B 88/12* (2013.01); *A47B 57/36* (2013.01); *A47B 88/0407* (2013.01); *A47B 96/07* (2013.01); *H05K 7/183* (2013.01)

(58) Field of Classification Search
CPC ....... A47B 96/07; A47B 96/068; A47B 88/12; A47B 88/493; A47B 88/43; H05K 7/183; H05K 7/18; F16L 3/015
USPC ..... 248/636, 220.43; 312/334.47, 333, 330.1
See application file for complete search history.

(56) References Cited

U.S. PATENT DOCUMENTS

| | | | | |
|---|---|---|---|---|
| 5,255,983 A | * | 10/1993 | Parvin ..................... | A47B 88/57 312/333 |
| 6,817,685 B2 | * | 11/2004 | Lammens ............. | A47B 88/493 312/333 |
| 8,919,897 B2 | * | 12/2014 | Chen ................... | E05D 15/0686 312/334.44 |
| 2016/0286683 A1 | * | 9/2016 | Chen ..................... | H05K 7/1489 |
| 2017/0013959 A1 | * | 1/2017 | Chen ...................... | A47B 96/07 |

* cited by examiner

*Primary Examiner* — Todd M Epps
(74) *Attorney, Agent, or Firm* — Rosenberg, Klein & Lee

(57) ABSTRACT

A slide rail assembly includes a front bracket with an opening, a first rail movably connected to the front bracket and having a stop, a buffer member fixed on the first rail and located in the opening, a second rail displaceable with respect to the first rail, and an engaging member provided on the second rail and corresponding to the stop. When the second rail is displaced from a first to a second extended position with respect to the first rail, the engaging member is pushed against the stop, generating an impact force and displacing the first rail from a first to a second position with respect to the front bracket. The buffer member absorbs the impact force by hitting a wall of the opening.

14 Claims, 9 Drawing Sheets

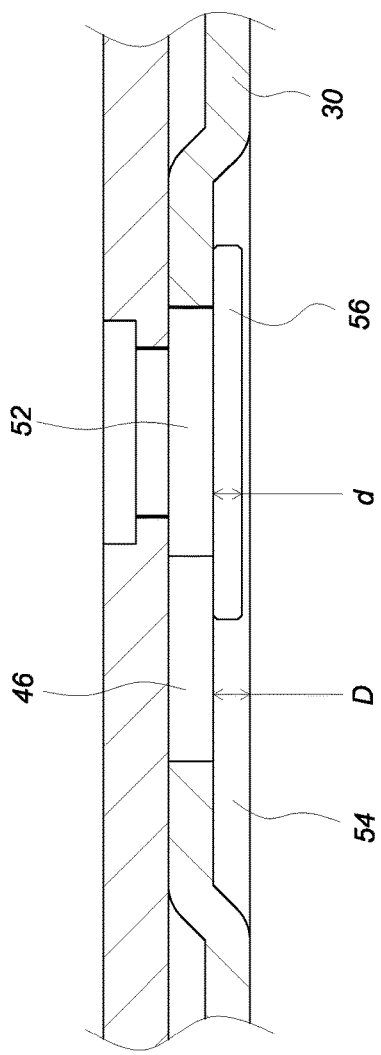
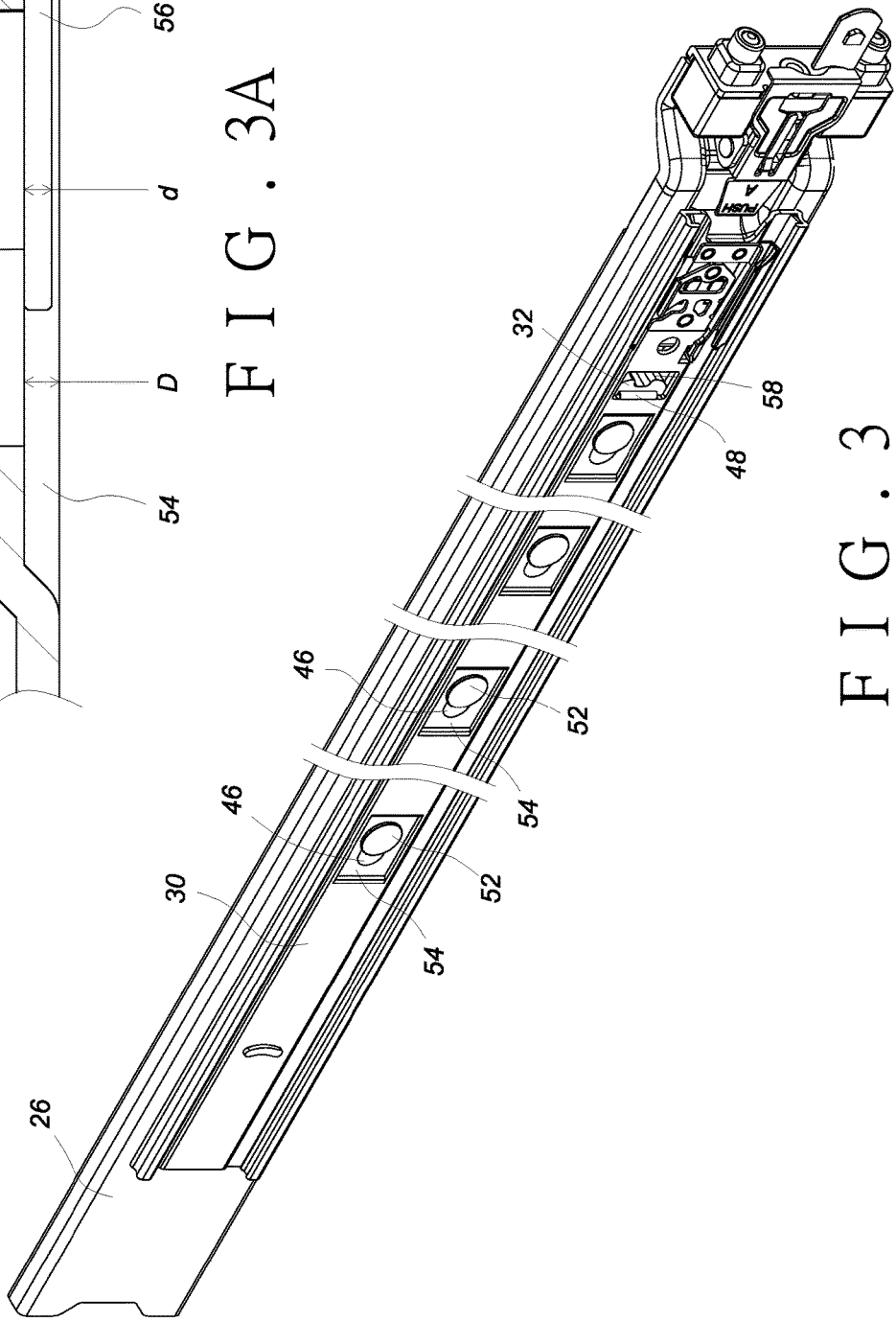
FIG. 3A
FIG. 3

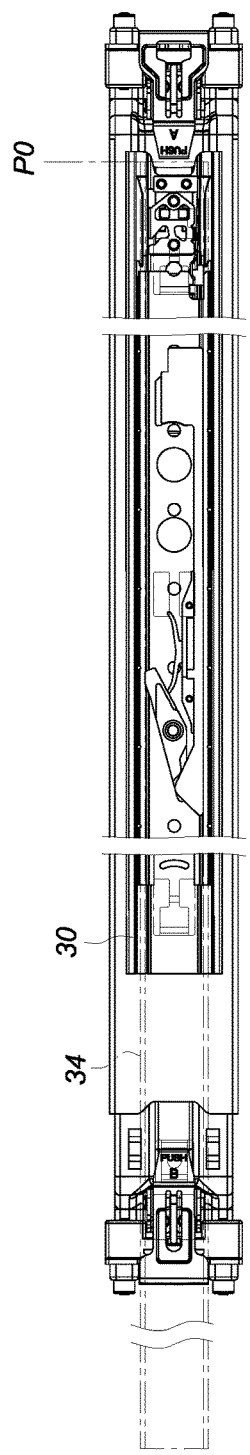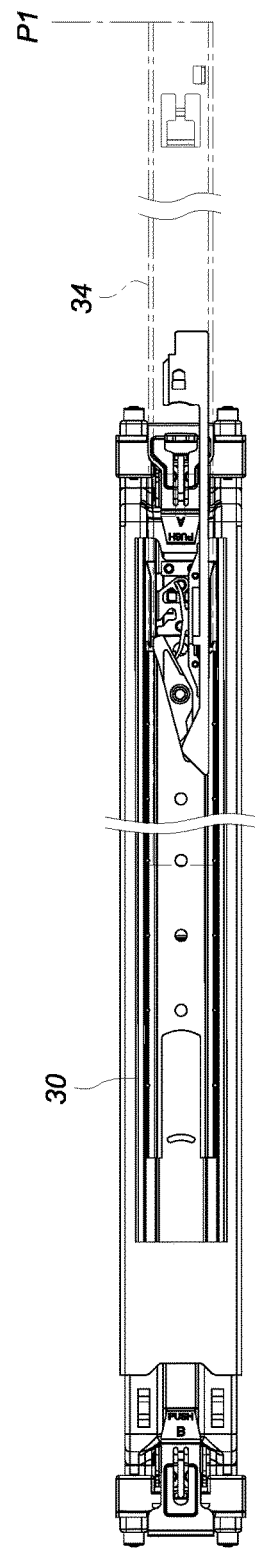
FIG. 5
FIG. 6

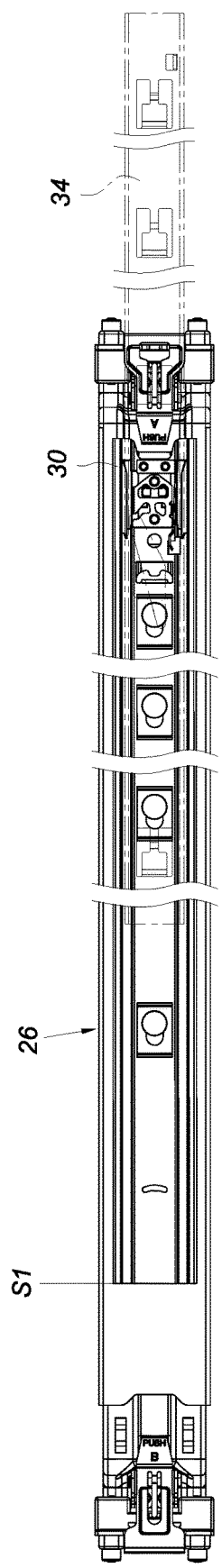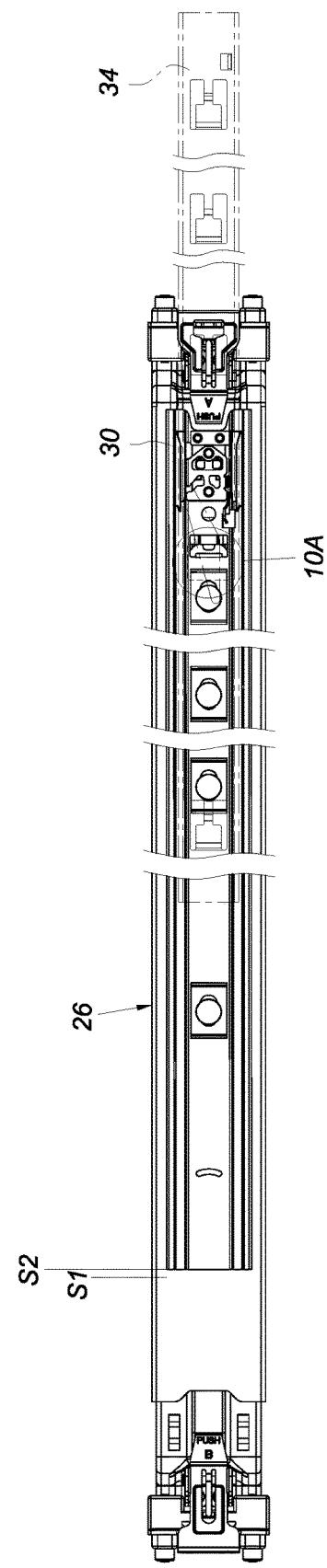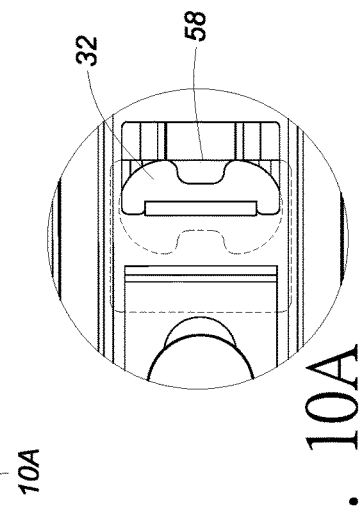
FIG. 9
FIG. 10
FIG. 10A

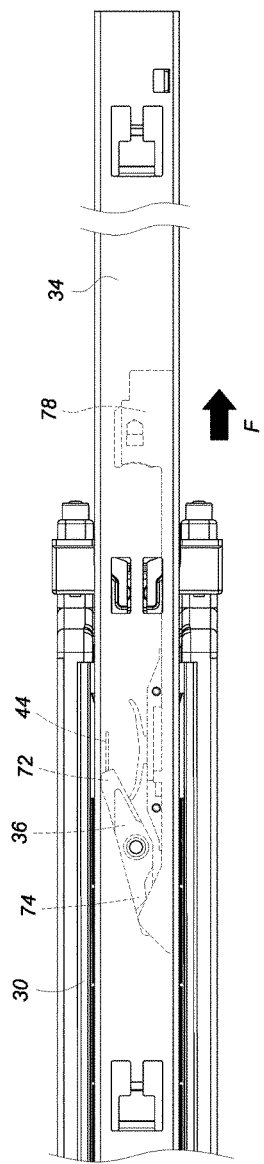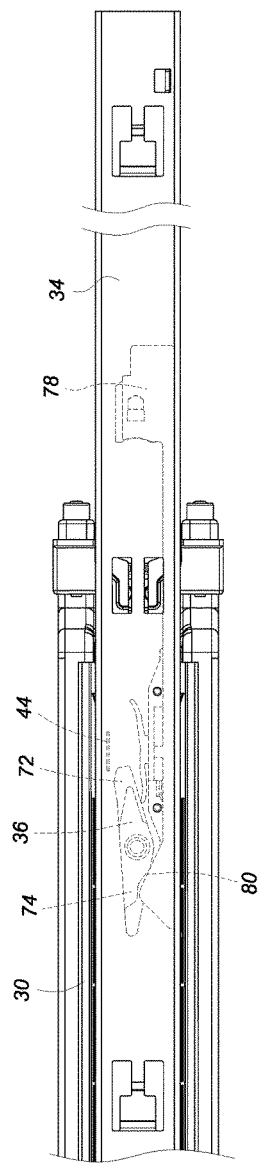

SLIDE RAIL ASSEMBLY

FIELD OF THE INVENTION

The present invention relates to a slide rail assembly and more particularly to one that has a buffering and stopping function whereby a buffer member can reduce the impact force acting on an engaging member when a slide rail is fully extended.

BACKGROUND OF THE INVENTION

Slide rails used in a drawer system, a rack system, or other similar systems essentially include a movable rail and a stationary rail. The movable rail is connected to a drawer, a server, or the like while the stationary rail is connected to a cabinet, a rack, or the like. To prevent the movable rail from separation from the stationary rail when fully extended, or to allow temporary detachment of the movable rail from the stationary rail, the movable rail is typically provided with a pivotable engaging member, and the stationary rail is typically provided with a stop. The engaging member engages with the stop when the movable rail is pulled out with respect to the stationary rail. Prior art in relation to such engaging members and stops are disclosed in, for example, U.S. Pat. No. 6,817,685 B2, granted to Lammens, and U.S. Pat. No. 5,255,983 A, granted to Parvin. The disclosures of both US patents are incorporated herein by reference.

The engaging member disclosed by Parvin is deformable by compression, so when a movable rail provided with this engaging member is pulled and extended to the greatest extent, the engaging member can absorb or reduce the impact force and sound generated by its being pushed against a stop. The engaging member, however, is subject to damage if it is the only component designed to absorb the impact force.

SUMMARY OF THE INVENTION

The present invention relates to the design of a buffering and stopping function that can reduce the impact force acting on a positioning engaging member of a slide rail assembly when a slide rail is pulled.

According to one aspect of the present invention, a slide rail assembly includes a front bracket, a first rail, a buffer member, a second rail, and an engaging member. The front bracket has an opening. The first rail is movably connected to the front bracket and includes a stop. The buffer member is fixedly mounted on the first rail and is in the opening. The second rail can be displaced with respect to the first rail. The engaging member is provided on the second rail and corresponds to the stop of the first rail.

According to another aspect of the present invention, a slide rail assembly is configured to be mounted between a first post and a second post and includes a front bracket, a rear bracket, a first rail, a buffer member, a second rail, and an engaging member. The front bracket is configured to be detachably mounted on the first post and has an opening. The rear bracket is configured to be detachably mounted on the second post. The first rail is movably connected to the front bracket and includes a stop. The buffer member is fixedly mounted on the first rail and is in the opening. The second rail can be displaced with respect to the first rail. The engaging member is provided on the second rail and corresponds to the stop of the first rail.

Preferably, according to any of the foregoing aspects, when the second rail is displaced from a retracted position to a first extended position with respect to the first rail, a portion of the second rail moves beyond the front end of the first rail. Moreover, when the second rail is displaced from the first extended position to a second extended position with respect to the first rail, the engaging member is pushed against the stop of the first rail, thereby generating an impact force; consequently, the first rail is displaced from a first position to a second position with respect to the front bracket, and the buffer member absorbs the impact force by hitting a wall of the opening of the front bracket.

In some embodiments according to any of the foregoing aspects, one of the front bracket and the first rail has a guiding portion of a predetermined length, and a connecting member is connected between the front bracket and the first rail through the guiding portion so that the first rail can be displaced from the first position to the second position with respect to the front bracket. Preferably, the first rail has a recess provided with the guiding portion, and the connecting member has an end portion in the recess. The thickness of the end portion is preferably less than or equal to the depth the recess.

In some embodiments according to any of the foregoing aspects, the first rail has a coupling portion, the coupling portion at least partially extends into the opening of the front bracket, and the buffer member is fixedly mounted at the coupling portion.

In some embodiments according to any of the foregoing aspects, the buffer member has an insertion hole, in which the coupling portion is fixedly mounted.

In some embodiments according to any of the foregoing aspects, the engaging member is pivotally connected to the second rail, and the slide rail assembly further includes an elastic member for applying an elastic force to the engaging member so that the engaging member corresponds to the stop of the first rail.

In some embodiments according to any of the foregoing aspects, the slide rail assembly further includes a releasing member movably connected to the second rail, and at least one of the releasing member and the engaging member has an inclined guide surface for guiding the engaging member to tilt with respect to the second rail by an angle and consequently move away from the stop of the first rail.

One advantageous feature of the present invention is that, when the second rail is pulled and thus pushes the engaging member against the stop of the first rail, generating an impact force, the first rail is displaced with respect to the front bracket by the second rail, causing the buffer member to hit the wall of the opening of the front bracket to absorb the impact force acting on the engaging member.

BRIEF DESCRIPTION OF THE DRAWINGS

FIG. 3 is an assembled perspective view of the first rail and the front bracket of the slide rail assembly in an embodiment of the present invention;

FIG. 3A is a partial sectional view of the first rail and the front bracket in FIG. 3;

FIG. 5 shows the second rail of the slide rail assembly in an embodiment of the present invention at a retracted position with respect to the first rail;

FIG. 6 shows the second rail in FIG. 5 displaced to a first extended position with respect to the first rail;

FIG. 9 shows the first rail of the slide rail assembly in an embodiment of the present invention at a first position with respect to the front bracket;

FIG. 10 shows the first rail in an embodiment of the present invention displaced to a second position with respect to the front bracket;

FIG. 10A is a partial enlarged view of FIG. 10, showing how the buffer member hits a wall of the opening of the front bracket;

FIG. 11 shows how an external force is applied to the releasing member of the slide rail assembly in an embodiment of the present invention to displace the releasing member longitudinally;

FIG. 12 shows how the first end of the engaging member in FIG. 11 is tilted by an angle with respect to the second rail.

DETAILED DESCRIPTION OF THE INVENTION

Figure 1:
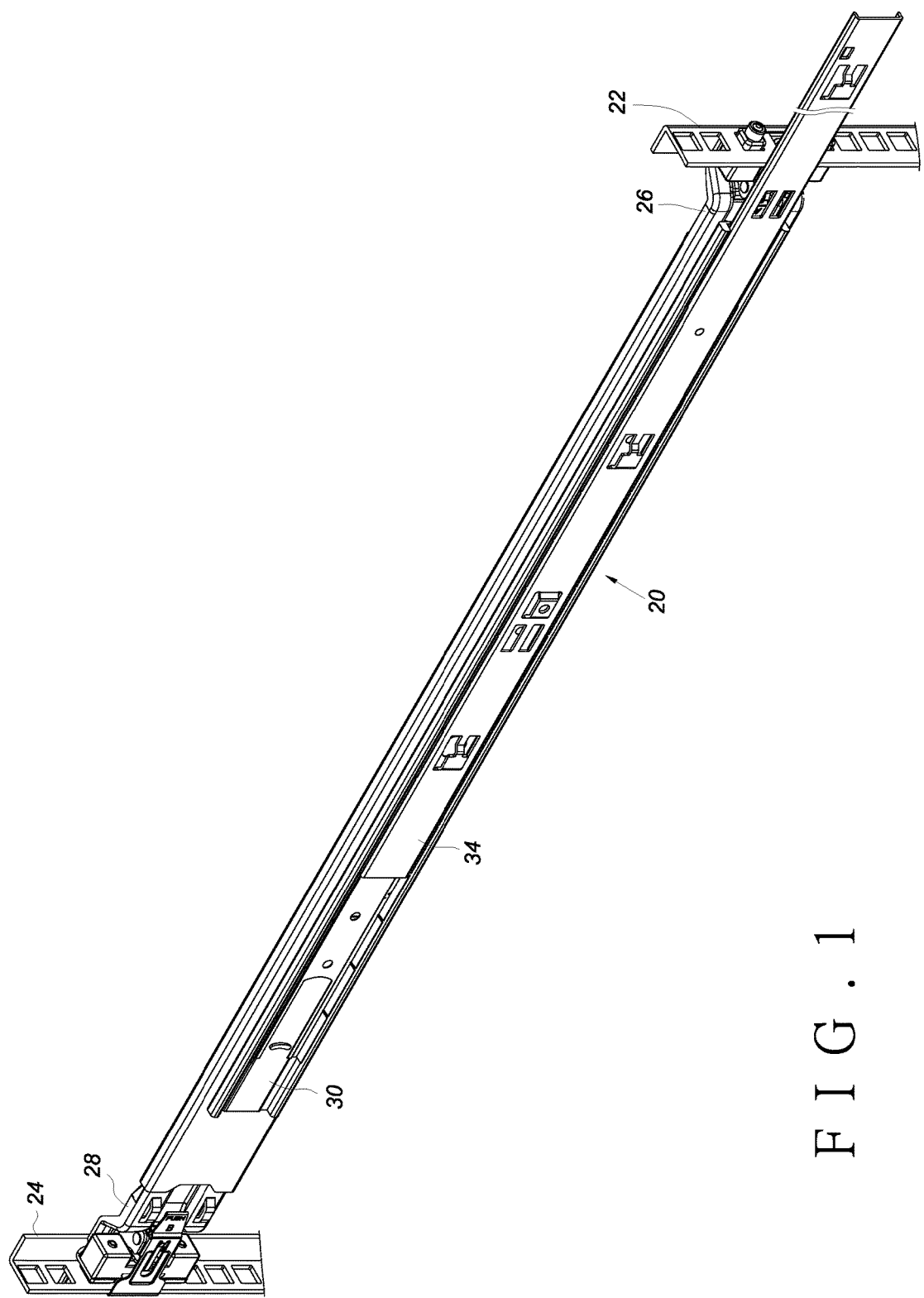
FIG. 1 is a perspective view showing how the slide rail assembly in an embodiment of the present invention is mounted to a first post and a second post.
Figure 2:
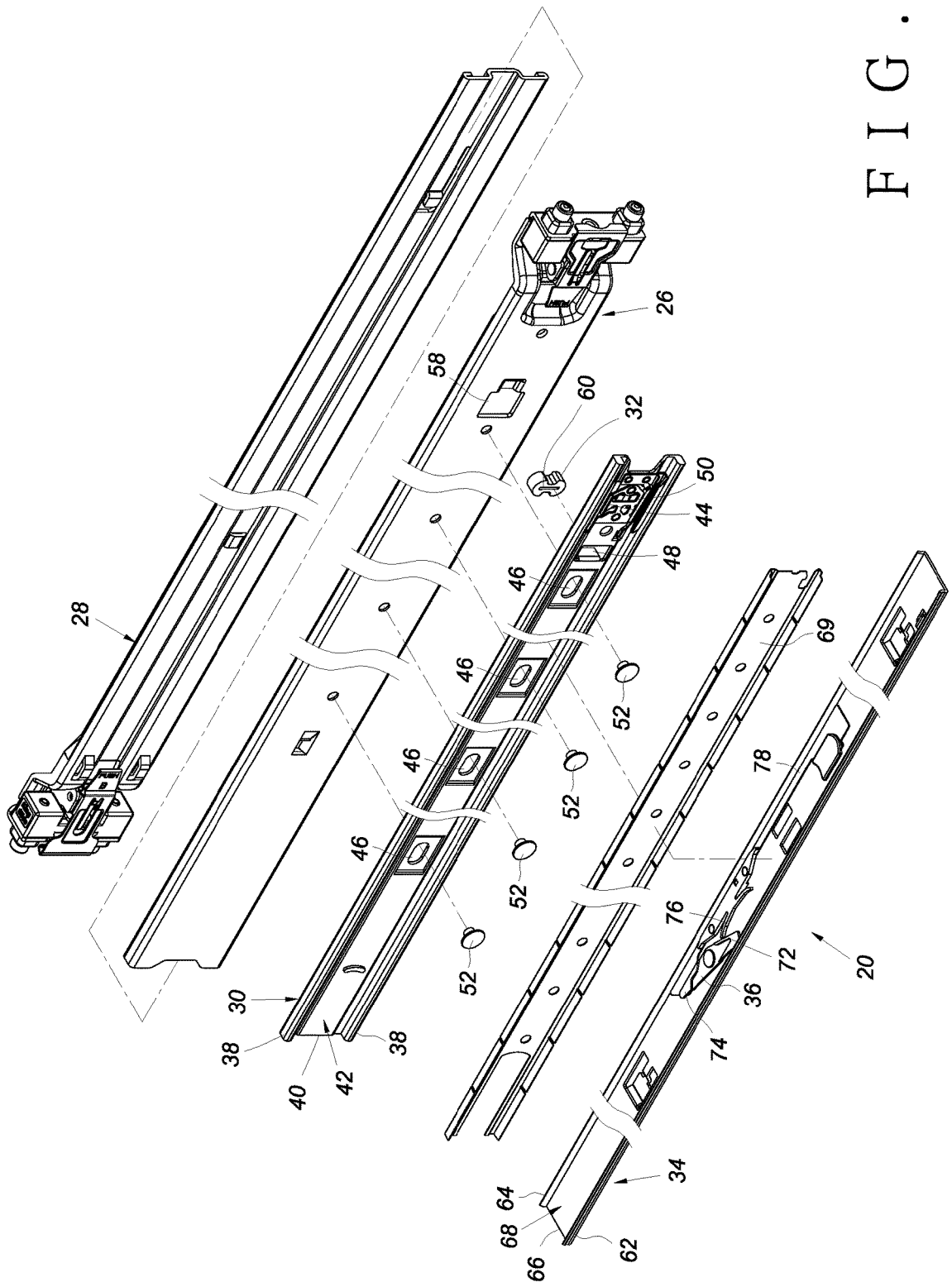
FIG. 2 is an exploded perspective view of the slide rail assembly in an embodiment of the present invention.

Referring to FIG. 1 and FIG. 2, the slide rail assembly 20 according to an embodiment of the present invention can be mounted to a first post 22 and a second post 24. The slide rail assembly 20 includes a front bracket 26, a rear bracket 28, a first rail 30, a buffer member 32, a second rail 34, and an engaging member 36. The front bracket 26 is detachably mounted on the first post 22 at a predetermined position. The rear bracket 28 is movably connected to the front bracket 26 and is detachably mounted on the second post 24. During the mounting process, the rear bracket 28 can be adjusted in length with respect to the front bracket 26 according to mounting requirements, in order to mount the slide rail assembly 20 between the first post 22 and the second post 24.

As shown in FIG. 2, the first rail 30 in this embodiment has a longitudinal length and includes a pair of edge walls 38 and a sidewall 40 extending and connected between the edge walls 38. The edge walls 38 and the inner side of the sidewall 40 jointly define a longitudinal passage 42. The first rail 30 further has a stop 44, a plurality of guiding portions 46, and a coupling portion 48. The stop 44 corresponds to the longitudinal passage 42. In this embodiment, the first rail 30 further has a base 50 fixedly connected to the front end of the first rail 30, and the stop 44 is provided on the base 50 and can therefore be viewed as a part of the first rail 30. The location of the stop 44, however, is not limited to the foregoing, as long as the first rail 30 is provided with the stop 44. In an embodiment that is not shown, for example, the stop 44 extends from the sidewall 40.

Referring to FIG. 2 and FIG. 3, each guiding portion 46 is a slot by way of example. The slots have a predetermined length and are each penetrated by a connecting member 52 fixedly connected to the front bracket 26 so that the first rail 30 can be longitudinally displaced with respect to the front bracket 26 within a limited space defined by the length of each slot. The locations of the guiding portions 46, however, are not limited to those disclosed herein, provided that the guiding portions 46 allow the first rail 30 to displace with respect to the front bracket 26. In an embodiment that is not shown, for example, the slots serving as the guiding portions 46 are formed in the front bracket 26.

Preferably, referring to FIG. 3 and FIG. 3A, the first rail 30 further has a plurality of recesses 54, in which the guiding portions 46 are respectively provided and each of which has a depth D, and each connecting member 52 has an end portion 56 lying in the corresponding recess 54. The end portion 56 has a thickness d less than or equal to the depth D.

Referring to FIG. 2 and FIG. 3, the coupling portion 48 is configured to couple with the buffer member 32. More specifically, the coupling portion 48 is, for example, a plate that extends from the first rail 30 toward the front bracket 26 and that is formed by stamping the first rail 30. The plate may at least partially extend into an opening 58 of the front bracket 26. The buffer member 32, on the other hand, has an insertion hole 60, in which the coupling portion 48 is fixedly mounted. The coupling portion 48 can be fixed in the insertion hole 60 by a close fit (with the diameter of the insertion hole 60 slightly less than the thickness of the plate), by adhesive, or by structural engagement, without limitation.

With continued reference to FIG. 2, the second rail 34 corresponds to the longitudinal passage 42 of the first rail 30 and includes a first wall 62, a second wall 64, and a longitudinal body 66 extending between the first wall 62 and the second wall 64. The first wall 62 and the second wall 64 correspond to the edge walls 38 of the first rail 30 respectively. The first wall 62, the second wall 64, and the longitudinal body 66 jointly define a passage 68. Preferably, a slide-facilitating member 69 is additionally provided between the first rail 30 and the second rail 34 to facilitate relative displacement between the first rail 30 and the second rail 34.

Figure 4:
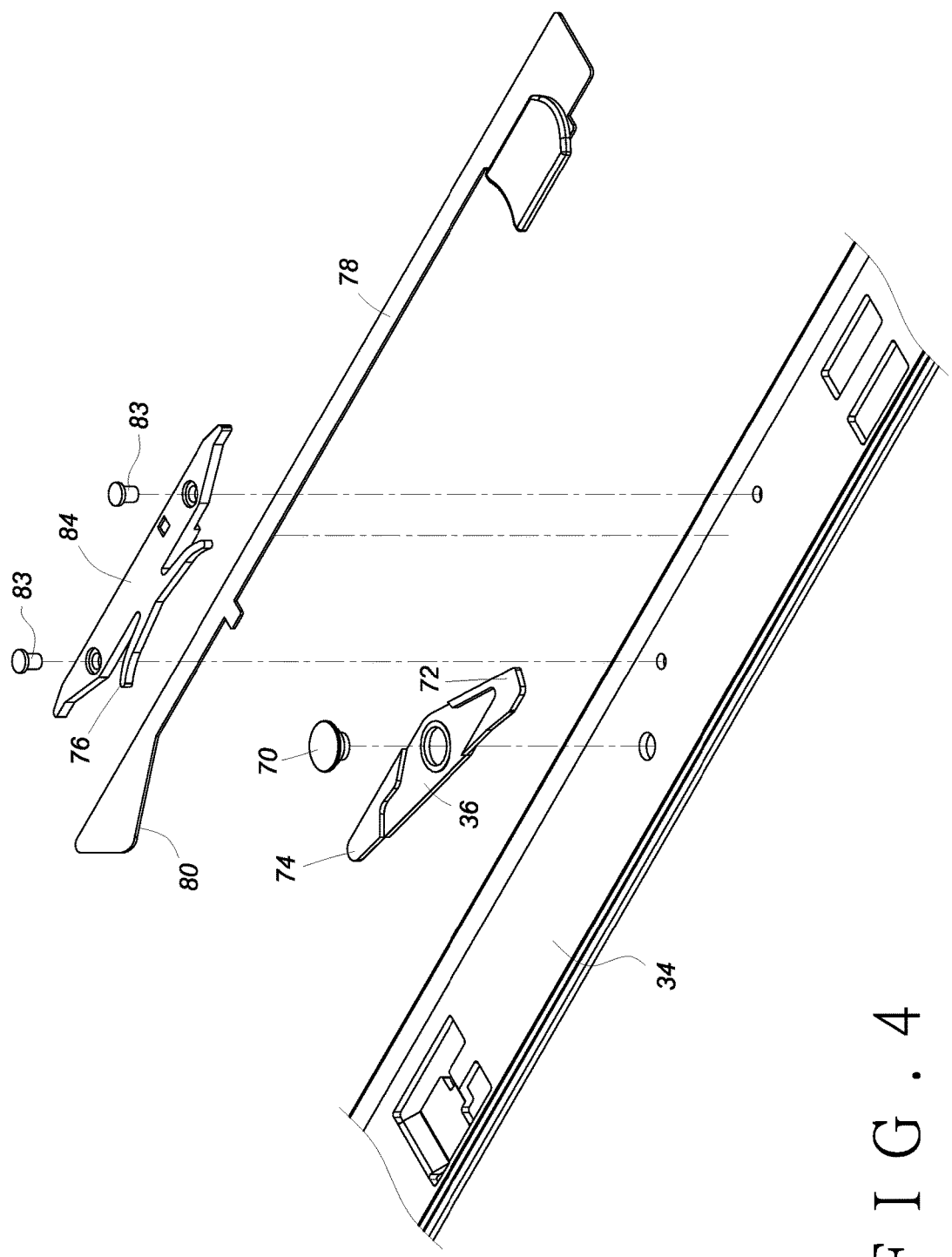
FIG. 4 is an exploded perspective view of the second rail, the engaging member, and the releasing member of the slide rail assembly in an embodiment of the present invention.

Referring to FIG. 2 and FIG. 4, the engaging member 36 is provided on the second rail 34 and in the passage 68. The engaging member 36 is configured to correspond to the stop 44 of the first rail 30. More specifically, the engaging member 36 is pivotally connected to the second rail 34, by a coupling member 70 for example, and has a first end 72 and an opposite second end 74. The first end 72 is configured to correspond to the stop 44 of the first rail 30 and be subjected to the elastic force of an elastic member 76 so as to be at a predetermined initial position. Preferably, the slide rail assembly 20 further includes a releasing member 78 movably connected to the second rail 34, and at least one of the releasing member 78 and the second end 74 of the engaging member 36 has an inclined guide surface 80 for guiding the first end 72 of the engaging member 36 to tilt with respect to the second rail 34 by an angle. In this embodiment, a base body 84 is fixedly coupled to the second rail 34, by a plurality of fixing members 83 for example. The base body 84 and the elastic member 76 are coupled together and are in the passage 68. As the base body 84 is fixedly connected to the second rail 34 by a coupling means such as riveting, locking, or scarfing, the base body 84 can be viewed as a part of the second rail 34. The releasing member 78 lies between the base body 84 and the longitudinal body 66 of the second rail 34 and can be displaced with respect to the second rail 34 under the restriction of the base body 84. The arrangement of the releasing member 78, however, is not limited to the above. In an embodiment that is not shown, for example, the second rail 34 is formed with a slide groove, through which the releasing member 78 is movably connected to the second rail 34.

Referring to FIG. 5 and FIG. 6, when the second rail 34 is longitudinally displaced from a retracted position P0 to a first extended position P1 with respect to the first rail 30, a portion of the second rail 34 moves beyond the front end of the first rail 30.

Figure 7:
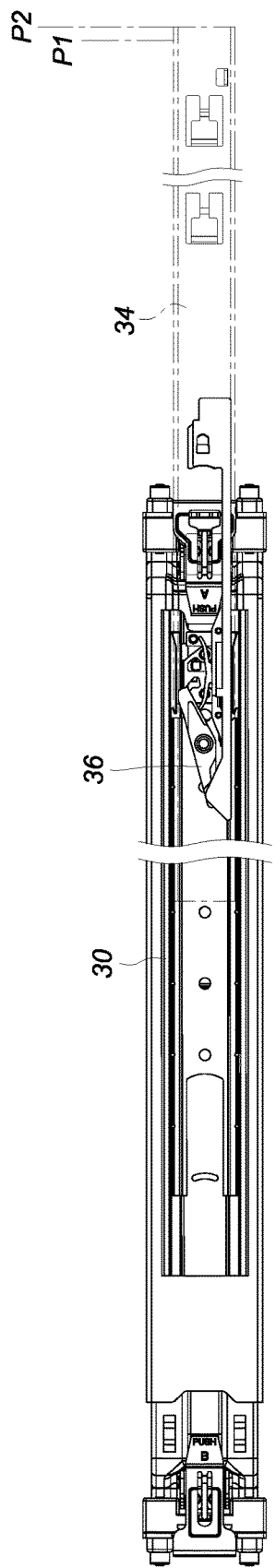
FIG. 7 shows the second rail in FIG. 6 further displaced to a second extended position with respect to the first rail.
Figure 8:
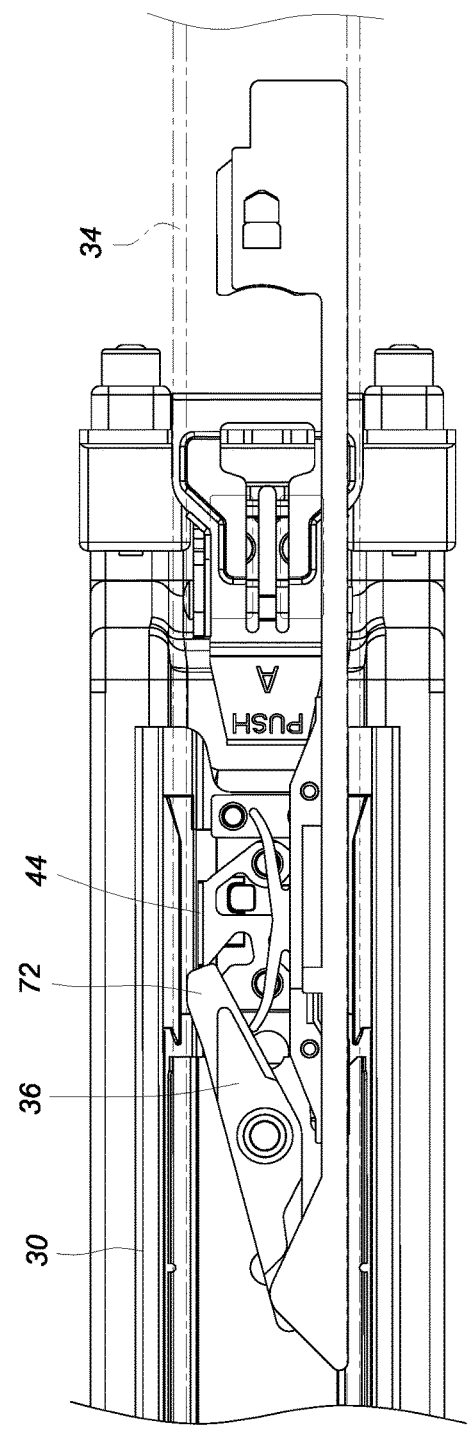
FIG. 8 is a partial enlarged view of FIG. 7, showing that the first end of the engaging member is pushed against the stop of the first rail.

Referring to FIG. 7 and FIG. 8, when the second rail 34 is further longitudinally displaced from the first extended position P1 to a second extended position P2 with respect to the first rail 30, the first end 72 of the engaging member 36 is pushed against the stop 44 of the first rail 30 and thereby generates an impact force. As a result, referring to FIG. 9, FIG. 10, and FIG. 10A, the first rail 30 is displaced by the second rail 34 from a first position S1 to a second position S2 with respect to the front bracket 26, and the impact force is absorbed by the buffer member 32 hitting a wall of the opening 58 of the front bracket 26.

Figure 13:
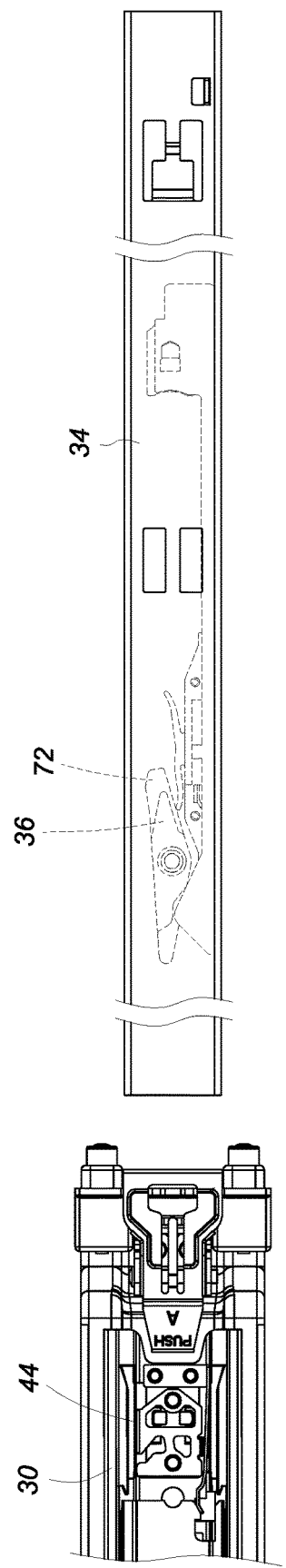
FIG. 13 shows how the second rail in FIG. 12 is removed.

When it is desired to remove the second rail 34 from the first rail 30, referring to FIG. 11 and FIG. 12, an external force F is applied to the releasing member 78 to displace the releasing member 78 longitudinally. The inclined guide surface 80 of the releasing member 78 will guide the second end 74 of the engaging member 36 and thereby tilt the first end 72 of the engaging member 36 with respect to the second rail 34 by an angle. Consequently, the first end 72 of the engaging member 36 is moved away from the stop 44 of the first rail 30, and the second rail 34 is no longer stopped or secured in position by the first rail 30 and can be subsequently removed (see FIG. 13).

While the present invention has been disclosed through the preferred embodiment described above, the embodiment is not intended to be restrictive of the scope of the invention. The scope of patent protection sought by the applicant is defined by the appended claims.

What is claimed is:

1. A slide rail assembly, comprising:
    a front bracket having an opening;
    a first rail movably connected to the front bracket, the first rail including a stop;
    a buffer member fixedly mounted on the first rail, the buffer member being in the opening;
    a second rail displaceable with respect to the first rail; and
    an engaging member provided on the second rail, the engaging member corresponding to the stop of the first rail;
    wherein when the second rail is displaced from a retracted position to a first extended position with respect to the first rail, a portion of the second rail moves beyond a front end of the first rail; and when the second rail is displaced from the first extended position to a second extended position with respect to the first rail, the engaging member is pushed against the stop of the first rail, thereby generating an impact force, and the first rail is displaced from a first position to a second position with respect to the front bracket such that the buffer member hits a wall of the opening of the front bracket and thus absorbs the impact force.

2. The slide rail assembly of claim 1, wherein one of the front bracket and the first rail has a guiding portion of a predetermined length, and a connecting member is connected between the front bracket and the first rail through the guiding portion to enable the first rail to displace from the first position to the second position with respect to the front bracket.

3. The slide rail assembly of claim 1, wherein the first rail has a recess provided with a guiding portion of a predetermined length; a connecting member is connected between the front bracket and the first rail through the guiding portion to enable the first rail to displace from the first position to the second position with respect to the front bracket; the recess has a depth, the connecting member has an end portion in the recess, and the end portion has a thickness less than or equal to the depth.

4. The slide rail assembly of claim 1, wherein the first rail has a coupling portion, the coupling portion at least partially extends into the opening of the front bracket, and the buffer member is fixedly mounted at the coupling portion.

5. The slide rail assembly of claim 4, wherein the buffer member has an insertion hole, and the coupling portion is fixedly mounted in the insertion hole.

6. The slide rail assembly of claim 1, wherein the engaging member is pivotally connected to the second rail, and the slide rail assembly further includes an elastic member for applying an elastic force to the engaging member in order for the engaging member to correspond to the stop of the first rail.

7. The slide rail assembly of claim 6, further comprising a releasing member movably connected to the second rail, wherein at least one of the releasing member and the engaging member has an inclined guide surface for guiding the engaging member to tilt with respect to the second rail by an angle and thus move away from the stop of the first rail.

8. A slide rail assembly configured to be mounted between a first post and a second post, the slide rail assembly comprising:
    a front bracket configured to be detachably mounted on the first post, the front bracket having an opening;
    a rear bracket configured to be detachably mounted on the second post;
    a first rail movably connected to the front bracket, the first rail comprising a stop;
    a buffer member fixedly mounted on the first rail, the buffer member being in the opening;
    a second rail displaceable with respect to the first rail; and
    an engaging member provided on the second rail, the engaging member corresponding to the stop of the first rail;
    wherein when the second rail is displaced from a retracted position to a first extended position with respect to the first rail, a portion of the second rail moves beyond a front end of the first rail; and when the second rail is displaced from the first extended position to a second extended position with respect to the first rail, the engaging member is pushed against the stop of the first rail, thereby generating an impact force, and the first rail is displaced from a first position to a second position with respect to the front bracket such that the buffer member hits a wall of the opening of the front bracket and thus absorbs the impact force.

9. The slide rail assembly of claim 8, wherein one of the front bracket and the first rail has a guiding portion of a predetermined length, and a connecting member is connected between the front bracket and the first rail through the guiding portion to enable the first rail to displace from the first position to the second position with respect to the front bracket.

10. The slide rail assembly of claim 8, wherein the first rail has a recess provided with a guiding portion of a predetermined length, a connecting member is connected between the front bracket and the first rail through the guiding portion to enable the first rail to displace from the first position to the second position with respect to the front bracket, the recess has a depth, the connecting member has an end portion in the recess, and the end portion has a thickness less than or equal to the depth.

11. The slide rail assembly of claim 8, wherein the first rail has a coupling portion, the coupling portion at least partially extends into the opening of the front bracket, and the buffer member is fixedly mounted at the coupling portion.

12. The slide rail assembly of claim 11, wherein the buffer member has an insertion hole, and the coupling portion is fixedly mounted in the insertion hole.

13. The slide rail assembly of claim 8, wherein the engaging member is pivotally connected to the second rail, and the slide rail assembly further comprises an elastic member for applying an elastic force to the engaging member in order for the engaging member to correspond to the stop of the first rail.

14. The slide rail assembly of claim 13, further comprising a releasing member movably connected to the second rail, wherein at least one of the releasing member and the engaging member has an inclined guide surface for guiding the engaging member to tilt with respect to the second rail by an angle and thus move away from the stop of the first rail.

\* \* \* \* \*